(12) United States Patent
Kuo et al.

(10) Patent No.: US 9,000,536 B2
(45) Date of Patent: Apr. 7, 2015

(54) FIN FIELD EFFECT TRANSISTOR HAVING A HIGHLY DOPED REGION

(71) Applicant: Taiwan Semiconductor Manufacturing Co., Ltd., Hsin-Chu (TW)

(72) Inventors: Chih-Wei Kuo, Tainan (TW); Hou-Yu Chen, Zhubei (TW); Shyh-Horng Yang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/930,242

(22) Filed: Jun. 28, 2013

(65) Prior Publication Data

US 2015/0001593 A1     Jan. 1, 2015

(51) Int. Cl.
H01L 29/76      (2006.01)
H01L 29/94      (2006.01)
H01L 31/062     (2012.01)
H01L 31/113     (2006.01)
H01L 31/119     (2006.01)
H01L 29/78      (2006.01)
H01L 29/66      (2006.01)

(52) U.S. Cl.
CPC ........ H01L 29/785 (2013.01); H01L 29/66795 (2013.01)

(58) Field of Classification Search
USPC .................................. 257/328, 401, E29.001
See application file for complete search history.

(56) References Cited

U.S. PATENT DOCUMENTS

| | | | | |
|---|---|---|---|---|
| 6,525,403 B2 * | 2/2003 | Inaba et al. | ................... | 257/618 |
| 7,015,078 B1 * | 3/2006 | Xiang et al. | .................. | 438/149 |
| 7,202,517 B2 * | 4/2007 | Dixit et al. | ..................... | 257/287 |
| 7,262,086 B2 * | 8/2007 | Yeo et al. | ....................... | 438/149 |
| 7,288,823 B2 * | 10/2007 | Youn et al. | .................... | 257/401 |
| 7,348,284 B2 * | 3/2008 | Doyle et al. | .................. | 438/142 |
| 7,687,859 B2 * | 3/2010 | Russ et al. | ..................... | 257/357 |
| 8,004,045 B2 * | 8/2011 | Sasaki et al. | .................. | 257/369 |
| 8,183,627 B2 * | 5/2012 | Currie | ........................... | 257/329 |
| 8,735,248 B2 * | 5/2014 | Lee et al. | ...................... | 438/268 |
| 8,877,592 B2 * | 11/2014 | Tsai et al. | ..................... | 438/283 |
| 2005/0272190 A1 * | 12/2005 | Lee et al. | ...................... | 438/176 |
| 2005/0272192 A1 * | 12/2005 | Oh et al. | ....................... | 438/197 |
| 2006/0141706 A1 * | 6/2006 | Hong | ............................ | 438/257 |
| 2006/0170066 A1 * | 8/2006 | Mathew et al. | ............... | 257/401 |
| 2008/0001234 A1 * | 1/2008 | Cheng et al. | .................. | 257/370 |
| 2008/0029828 A1 * | 2/2008 | Oh et al. | ....................... | 257/401 |
| 2008/0203491 A1 * | 8/2008 | Anderson et al. | ............. | 257/372 |
| 2009/0057761 A1 * | 3/2009 | Kim et al. | ..................... | 257/344 |
| 2010/0264472 A1 * | 10/2010 | Fehlhaber et al. | ............ | 257/288 |
| 2013/0078818 A1 * | 3/2013 | Lin et al. | ....................... | 438/761 |
| 2013/0092984 A1 * | 4/2013 | Liu et al. | ....................... | 257/288 |

* cited by examiner

*Primary Examiner* — Ida M Soward
(74) *Attorney, Agent, or Firm* — Eschweiler & Associates, LLC

(57) ABSTRACT

The present disclosure relates a Fin field effect transistor (FinFET) device having large effective oxide thickness that mitigates hot carrier injection, and an associated method of formation. In some embodiments, the FinFET device has a conductive channel of a first fin protruding from a planar substrate. The conductive channel has a non-conductive highly doped region located along multiple outer edges of the channel region. A gate region protrudes from the planar substrate as a second fin that overlies the first fin. A gate dielectric region is located between the non-conductive highly doped region and the gate region. The non-conductive highly doped region and the gate dielectric region collectively provide for an effective oxide thickness of the FinFET device that allow a low electric field across gate oxide and less hot carrier injection.

20 Claims, 9 Drawing Sheets

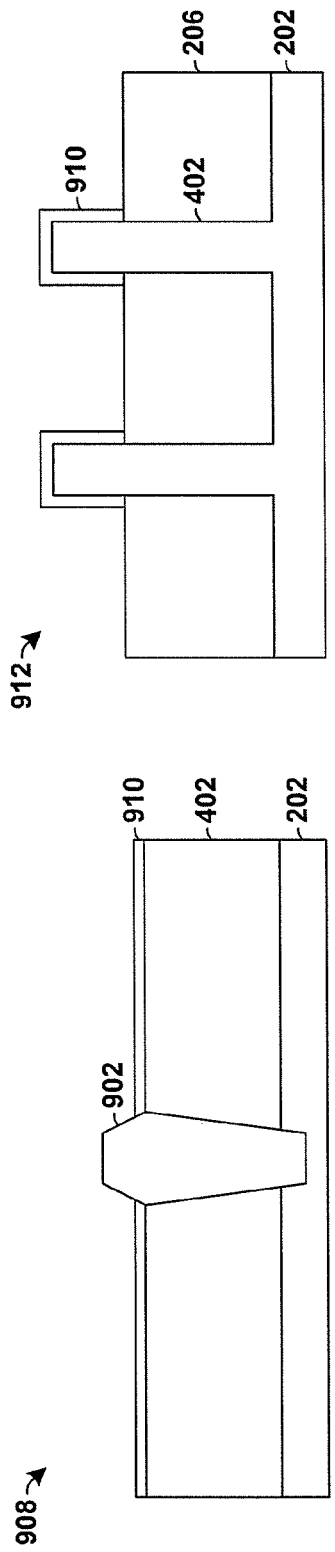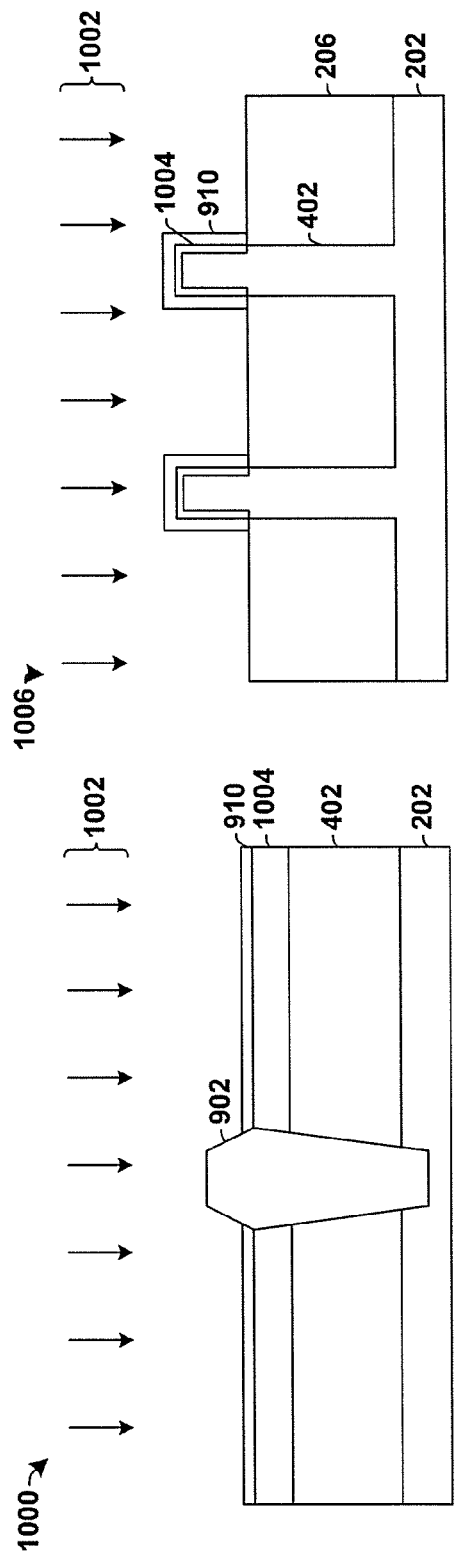

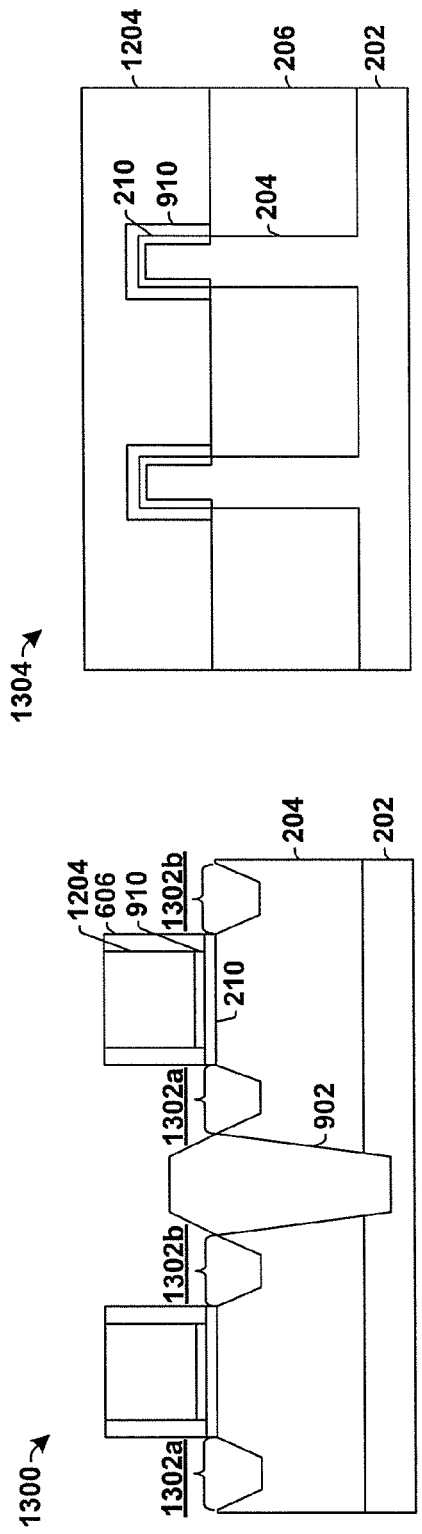
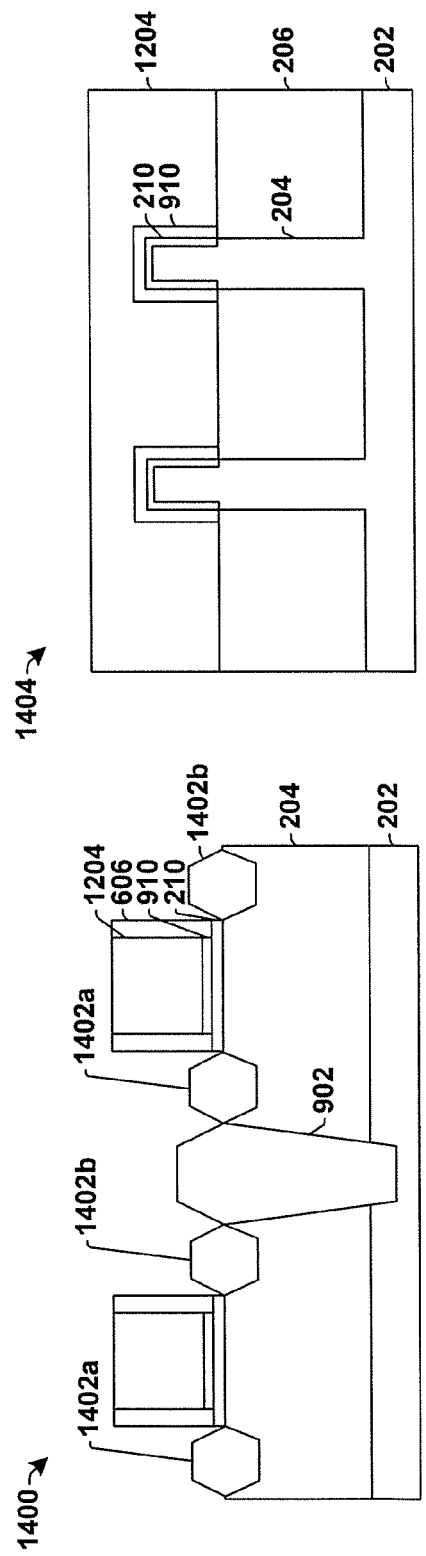
Fig. 13
Fig. 14

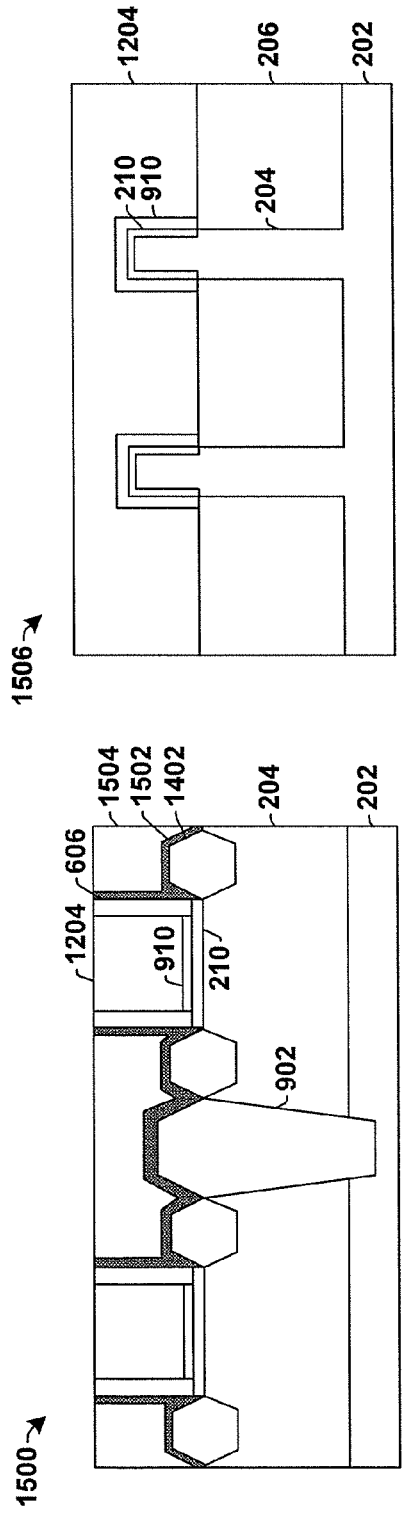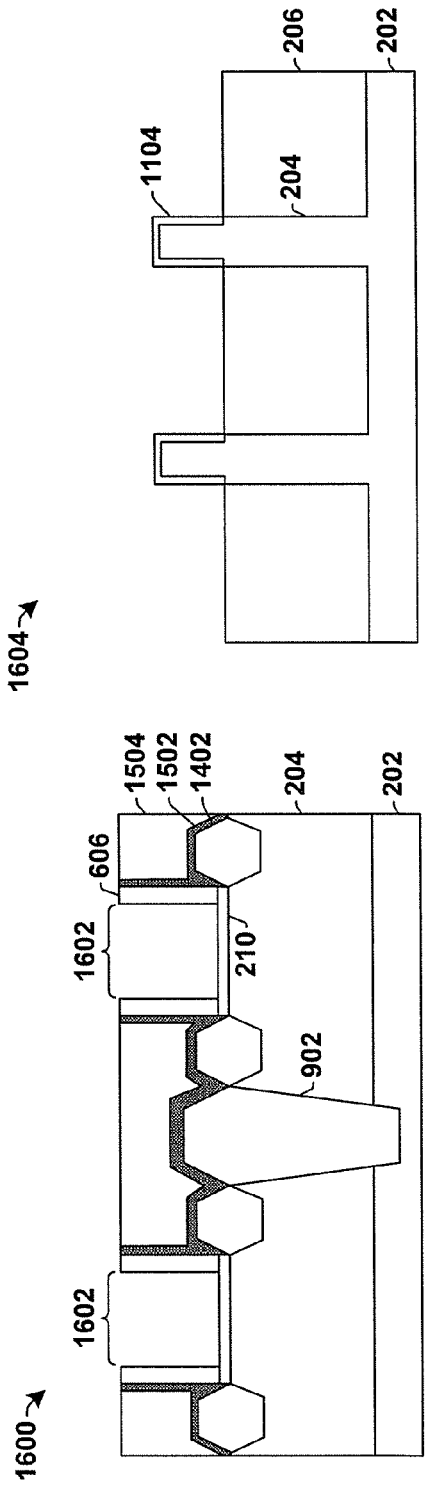
Fig. 15
Fig. 16

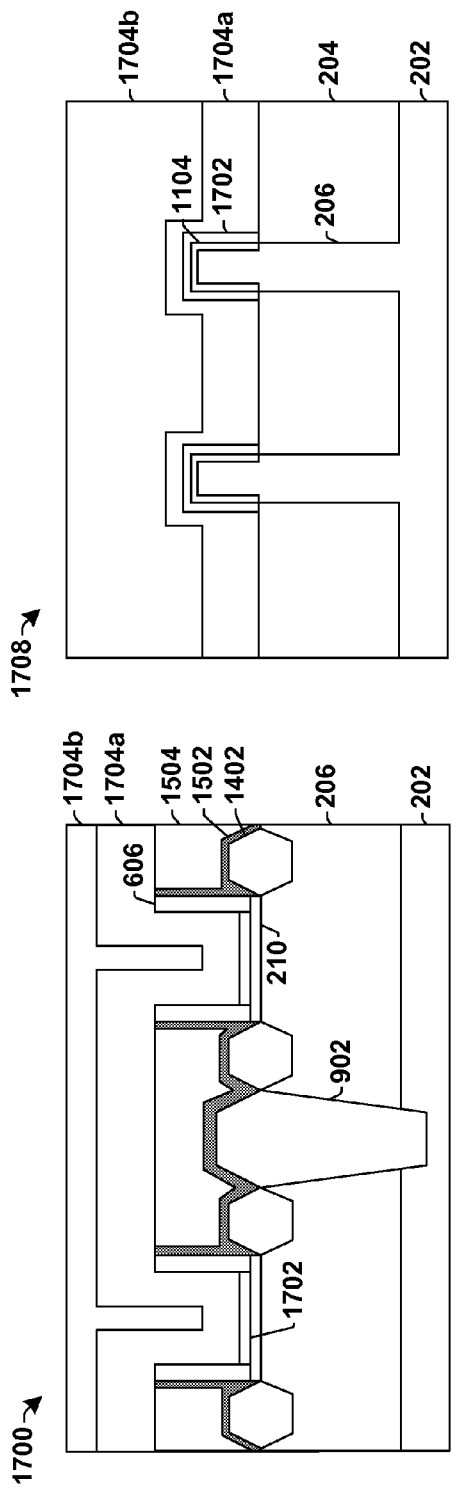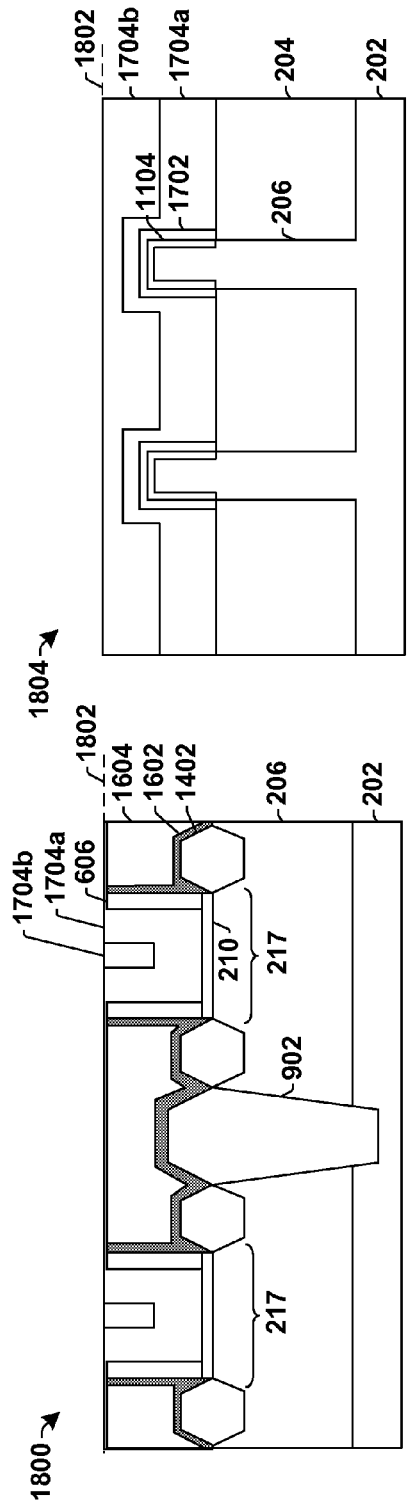

FIN FIELD EFFECT TRANSISTOR HAVING A HIGHLY DOPED REGION

BACKGROUND

As integrated chips continue to decrease in size, limitations in processing capabilities and in fundamental material characteristics have made scaling of planar CMOS transistors increasingly difficult (e.g., due to leakage current and process variations). FinFET (Field effect transistors) devices have long been looked to as a promising alternative to planar CMOS transistors. In recent years, advances in processing technology have made FinFET devices a viable option in emerging technologies (e.g., 22 nm and below).

FinFET devices are three-dimensional structures that have a conducting channel comprising a fin of semiconducting material that rises above a planar substrate as a three-dimensional structure. A gate structure, configured to control the flow of charge carriers within the conducting channel, wraps around the fin of semiconducting material. For example, in a tri-gate FinFET structure, the gate structure wraps around three sides of the fin of semiconducting material, thereby forming conductive channels on three sides of the fin.

BRIEF DESCRIPTION OF THE DRAWINGS

FIGS. 9A-18 illustrate some embodiments of a semiconductor substrate upon which method of forming an active pixel sensor is enacted, according to the method of FIG. 8.

DETAILED DESCRIPTION

Figure 1:
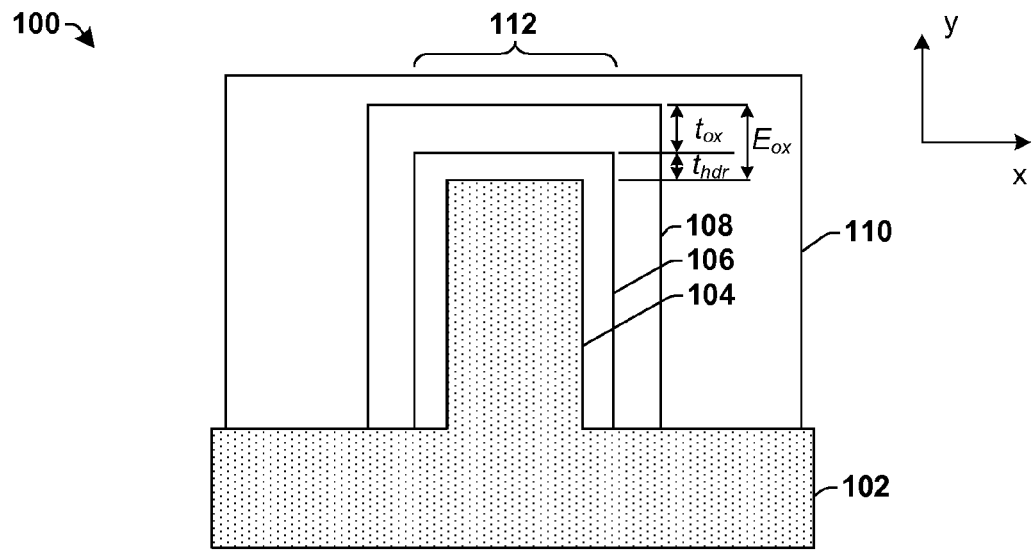
FIG. 1 illustrates some embodiments of a cross-sectional view of a gate structure of a disclosed FinFET device.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It will be appreciated that the details of the figures are not intended to limit the disclosure, but rather are non-limiting embodiments. For example, it may be evident, however, to one of ordinary skill in the art, that one or more aspects described herein may be practiced with a lesser degree of these specific details. In other instances, known structures and devices are shown in block diagram form to facilitate understanding.

Hot carrier injection (HCI) is a phenomenon by which charge carriers have a sufficient kinetic energy to overcome an electric potential. In field effect transistors, the charge carriers with a high kinetic energy can be injected (i.e., to enter) into normally forbidden regions of a transistor device, such as a gate dielectric layer. Once in such a region, the charge carriers may be trapped and cause interface states to be generated, leading to threshold voltage shifts and transconductance degradation of MOS devices, for example.

The geometries of FinFET devices increase the probability of hot carrier injection into a gate dielectric layer relative to that of planar field effect transistors. For example, a narrow fin width of a FinET transistor increases the probability of hot carrier injection into a gate dielectric layer. Therefore, as a fin width (i.e., channel thickness) of a FinFET transistor decreases, device degradation by hot carrier injection becomes a significant reliability concern for semiconductor manufacturers.

Accordingly, the present disclosure relates to a FinFET device having large effective oxide thickness that mitigates hot carrier injection, and an associated method of formation. In some embodiments, the FinFET device comprises a conductive channel having a first fin protruding from a planar substrate. The conductive channel comprises a non-conductive highly doped region located along multiple outer edges of the channel region. A gate region protrudes from the planar substrate as a second fin that overlies the first fin. A gate dielectric region is located between the non-conductive highly doped region and the gate region. The non-conductive highly doped region and the gate dielectric region collectively provide for an effective oxide thickness of the FinFET device that allows a low electric field across gate oxide and less hot carrier injection.

FIG. 1 illustrates a cross-sectional view of some embodiments of a gate structure 112 of a disclosed FinFET device 100.

The gate structure 112 comprises a three-dimensional fin 104 protruding from a planar substrate 102. In various embodiments, the planar substrate 102 may comprise any type of semiconductor body (e.g., silicon, silicon-germanium, silicon-on-insulator) such as a semiconductor wafer and/or one or more die on a semiconductor wafer, as well as any other type of semiconductor and/or epitaxial layers associated therewith. The three-dimensional fin 104 comprises a semiconductor material and acts as a conductive channel that extends (into the plane of the paper) between a source region and drain region of the FinFET device 100.

A non-conductive highly doped region 106 is located along one or more outer edges of the three-dimensional fin 104. The non-conductive highly doped region 106 comprises a dopant concentration that is high enough to prevent the flow of charge carriers. For example, the non-conductive highly doped region 106 may comprise a doping concentration that is higher along the outer edges of the three-dimensional fin 104 than within a bulk of the three-dimensional fin 104. The higher doping concentration forms a non-conductive region, since as the doping concentration increases within the non-conductive highly doped region 106 the threshold voltage increases (i.e., a greater voltage is needed to achieve an inversion layer) and prevents the formation of a channel within the highly doped region. In some embodiments, the non-conductive highly doped region 106 has a doping concentration that is in a range of between approximately $10E18$ $cm^{-3}$ and approximately $10E20$ $cm^{-3}$.

A gate dielectric layer 108 is located over the non-conductive highly doped region 106. In some embodiments, the gate dielectric layer 108 comprises a silicon dioxide (e.g., $SiO_2$) layer. In some embodiments, the three-dimensional fin 104 is embedded within the gate dielectric layer 108, so that the gate dielectric layer 108 has bottom surface comprising a concave curvature that wraps around the non-conductive highly doped region 106 within the three-dimensional fin 104 (i.e., so that an inner surface of the gate dielectric layer 108 abuts an outer surface of the non-conductive highly doped region 106). For example, the gate dielectric layer 108 may be disposed around the non-conductive highly doped region 106, so that the non-conductive highly doped region 106 is nested within the gate dielectric layer 108 as concentric structures.

A gate material 110 is located over the three-dimensional fin 104. The gate material 110 is separated from the three-dimensional fin 104 by the non-conductive highly doped region 106 and by the gate dielectric layer 108. In some embodiments, the gate material 110 comprises a three-dimensional structure protruding from the planar substrate 102, which overlies the three-dimensional fin 104. In some embodiments, the gate material 110 comprises a second fin that overlies the three-dimensional fin 104.

The non-conductive highly doped region 106 has a first thickness $t_{hdr}$ and the gate material 110 has a second thickness $t_{ox}$ on the top and sidewalls of the three-dimensional fin 104. The effective oxide thickness $E_{ox}$ of the FinFET transistor device 100 is equal to the sum of the first thickness $t_{hdr}$ and the second thickness $t_{ox}$. The effective oxide thickness $E_{ox}$ of the FinFET device allows a low electric field across the gate oxide and less hot carrier injection.

Figure 2:
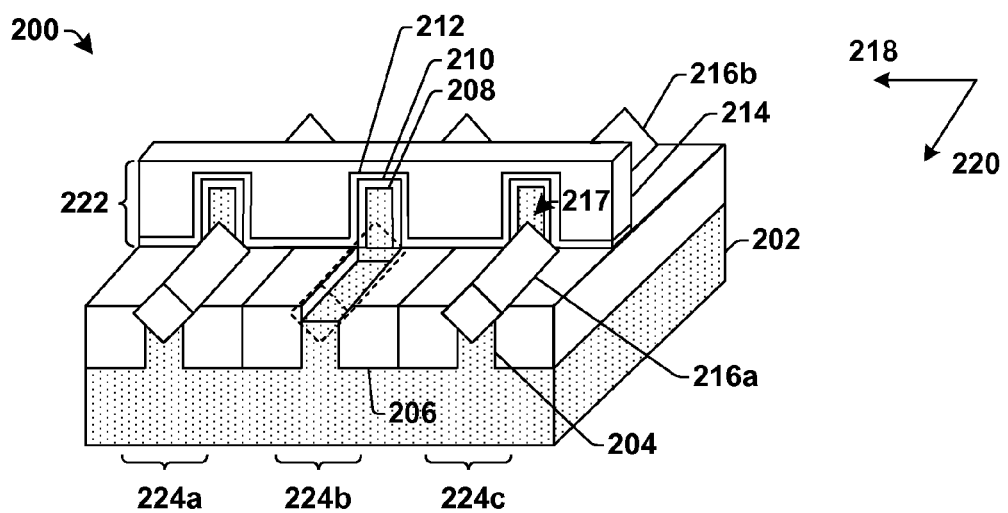
FIG. 2 illustrates a three-dimensional view of some embodiments of a multi-gate FinFET device having a disclosed gate structure.

FIG. 2 illustrates a three-dimensional view of some embodiments of a FinFET device 200 having a disclosed gate structure. The FinFET device 200 comprises a multi-gate FinFET device having a first gate 224a, a second gate 224b, and a third gate 224c. It will be appreciated that although the FinFET device 200 is illustrated as a multi-gate device having three gates, that a disclosed FinFET device may comprise any number of gates (e.g., 1 gate, 2 gates, gates 4, gates 5, etc.).

The FinFET device 200 comprises sections of semiconductor material 204 that protrude outward from a planar semiconductor substrate 202. The sections of semiconductor material 204 are separated by sections of dielectric material 206, so that the sections of dielectric material 206 are interleaved between the sections of semiconductor material 204 along a first direction 218. The sections of semiconductor material 204 extend between a source region 216a and a drain region 216b, along a second direction 220 perpendicular to the first direction 218.

The sections of semiconductor material 204 comprise three-dimensional fin structures 208 that protrude between the source region 216a and drain region 216b as a conductive channel 217. A non-conductive highly doped region 210 is located along one or more outer edges of the three-dimensional fin structures 208. In some embodiments, the highly doped region 210 comprises sidewalls that form a planar surface with the sidewalls of the underlying sections of semiconductor material 204.

In some embodiments, the non-conductive highly doped region 210 has a dopant species comprising boron (B). In other embodiments, the highly doped region 210 has a dopant species comprising borondifluoride ($BF_2$). The fluorine species is configured to improve surface passivation to improve mobility within the conductive channel 217.

A gate structure 222, extending along the first direction 218, overlies the alternating sections of semiconductor material 204 and sections of dielectric material 206. The gate structure 222 comprises a gate dielectric layer 212 and a gate material 214. The gate dielectric layer 212 separates the gate material 214 from the non-conductive highly doped region 210 within the fin structure 208.

In some embodiments, the gate dielectric layer 212 may comprise silicon dioxide. In other embodiments, the gate dielectric layer 212 may comprise a high-k dielectric layer such as hafnium oxide ($HfO_2$), $TiO_2$, HfZrO, $Ta_2O_3$, $HfSiO_4$, $ZrO_2$, $ZrSiO_2$, etc. The gate material 214 may comprise a conductive layer, such as polysilicon or aluminum, for example. In some embodiments, the gate material 214 may comprise a work function layer disposed between the gate dielectric layer and the conductive layer and configured to have a proper work function to enhance performance of the FinFET device 200.

Figure 3:
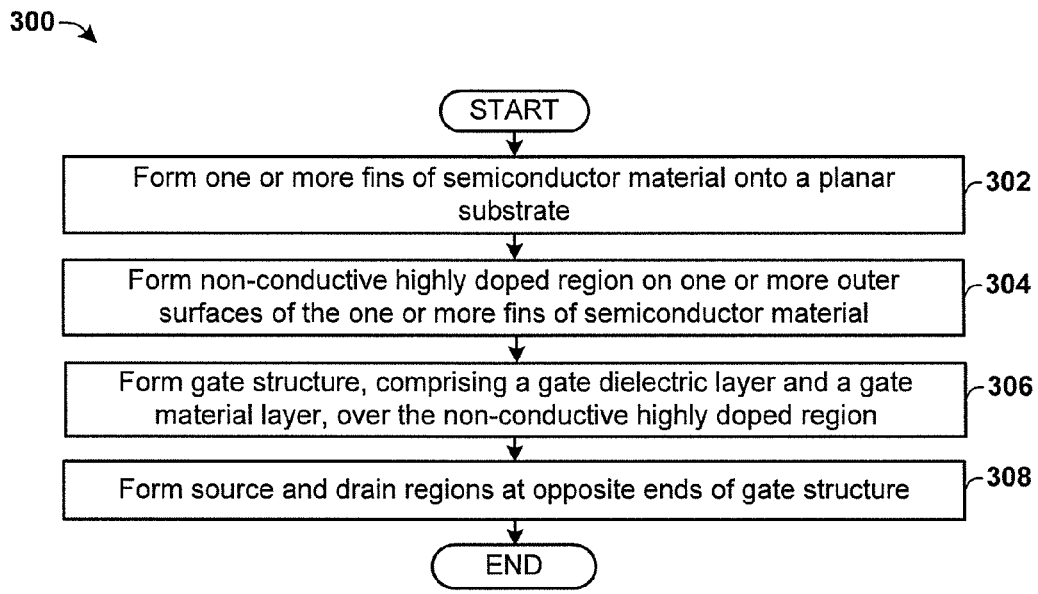
FIG. 3 illustrates some embodiments of a method of forming a FinFET device comprising the disclosed gate structure.

FIG. 3 illustrates some embodiments of a method 300 of forming a FinFET device comprising the disclosed gate structure.

It will be appreciated that the disclosed methods (e.g., methods 300 and 800) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 302, one or more fins of semiconductor material are formed onto a planar substrate. In some embodiments, one or more fins of semiconductor material are separated by sections of dielectric material, so that the sections of dielectric material are interleaved between the one or more fins of semiconductor material.

At 304, a non-conductive highly doped region is formed on one or more outer surfaces of the one or more three-dimensional fins of semiconductor material.

At 306, a gate structure, comprising a gate dielectric layer and a gate material layer, is formed over the non-conductive highly doped region. The gate dielectric layer separates the gate material layer from the non-conductive highly doped region.

At 308, source and drain regions are formed at opposite ends of the gate structure. In some embodiments, the one or more fins of semiconductor material may be selectively recessed to form a source and drain recesses, in which the source and drain regions are formed.

FIGS. 4-7 illustrate three-dimensional views of some embodiments of an exemplary semiconductor substrate, whereon a method, according to method 300, is implemented. Although FIGS. 4-7 are described in relation to method 300, it will be appreciated that the structures disclosed in FIGS. 4-7 are not limited to such a method.

Figure 4:
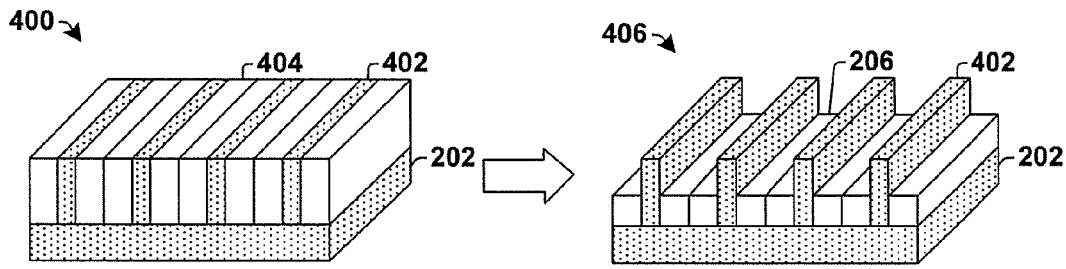
FIGS. 4-7 illustrate some embodiments of a semiconductor substrate upon which method of forming an active pixel sensor is enacted, according to the method of FIG. 3.

FIG. 4 illustrates some embodiments of three-dimensional views, 400 and 406, of a substrate corresponding to act 302. As shown in three-dimensional view 400, the substrate comprises sections of semiconductor material 402 that protrude outward from a planar semiconductor substrate 202. The sections of semiconductor material 402 are separated by sections of dielectric material 404, so that the sections of dielectric material 404 are interleaved between the sections of semiconductor material 402. As shown in three-dimensional view 406, the dielectric material 206 is etched back so that the sections of semiconductor material 402 protrude as one or more fins of semiconductor material above the sections of dielectric material 206. In some embodiments, the dielectric material 206 may be etched using a wet or dry etchant.

Figure 5:
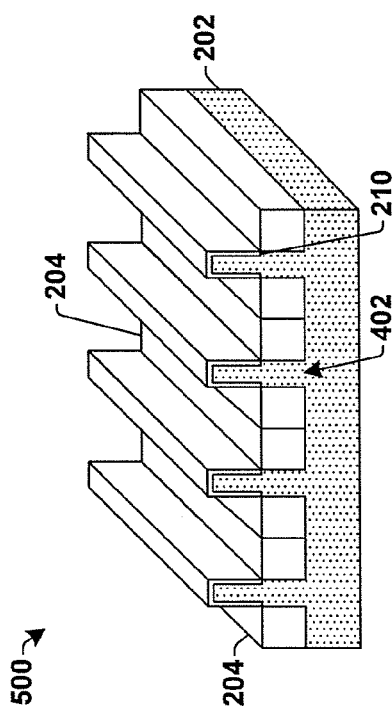

FIG. 5 illustrates some embodiments of a three-dimensional view 500 of a substrate corresponding to act 304. As shown in three-dimensional view 500, a non-conductive highly doped region 210 is formed along an outer surface of the sections of semiconductor material 402. The non-conductive highly doped region 210 may be formed by selectively implanting the sections of semiconductor material 402 with a dopant having a concentration having a range of between 1E18 $cm^{-3}$ and 1E20 $cm^{-3}$.

Figure 6:
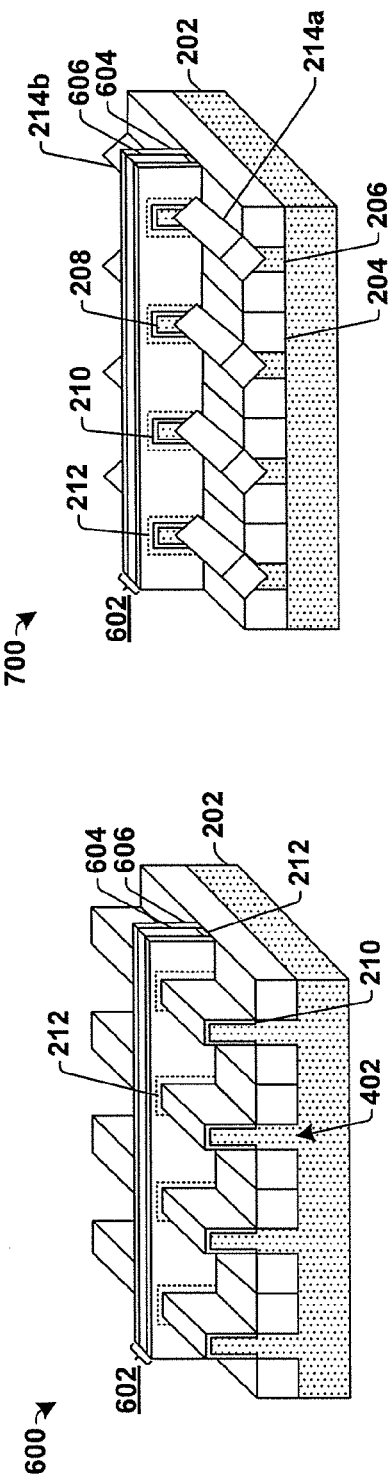

FIG. 6 illustrates some embodiments of a three-dimensional view 600 of a substrate corresponding to act 306. As shown in three-dimensional view 600, a gate structure 602 is formed over the non-conductive highly doped region 210. The gate structure 602 straddles the protruding sections of semiconductor material 402 along an interface comprising the non-conductive highly doped region 210. The gate structure 602 comprises a gate dielectric layer 212 and a gate material 604. In some embodiments, sidewalls spacers 606 may be located on opposing sides of the gate structure 602.

In some embodiments, the gate dielectric layer 212 may comprise an oxide (e.g., $SiO_2$). The gate dielectric layer 212 may be formed onto the semiconductor substrate 202 by way of a deposition technique (e.g., chemical vapor deposition, physical vapor deposition, etc.). In some embodiments, the gate material 604 may comprise a polysilicon material or a high-k metal gate material (e.g., aluminum). The gate material 604 may be formed onto the semiconductor substrate 202 by way of a deposition technique.

Figure 7:
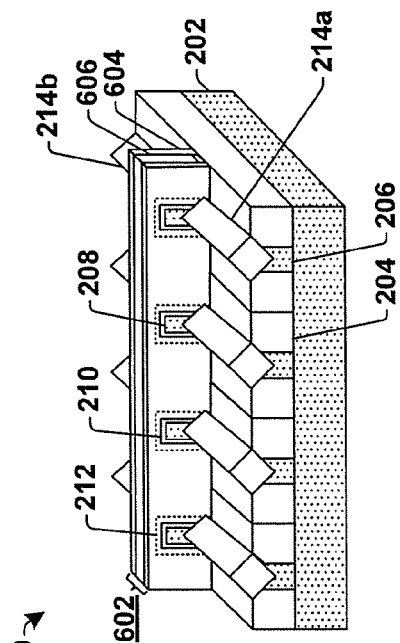

FIG. 7 illustrates some embodiments of a three-dimensional view 700 of a substrate corresponding to act 308. As shown in three-dimensional view 700, sections of semiconductor material 402 are removed to form a source recess and a drain recess on opposite sides of the gate structure 602. Forming source and drain recesses results in the formation of a three-dimensional fin structure 208 that protrudes from the planar semiconductor substrate 202 at a position below the gate structure 602. A source region 216a and a drain region 216b are then formed at opposite ends of the one or more three-dimensional fin structures 208. In some embodiments, the source region 216a and a drain region 216b may be formed by an epitaxial growth of a doped semiconductor material.

Figure 8:
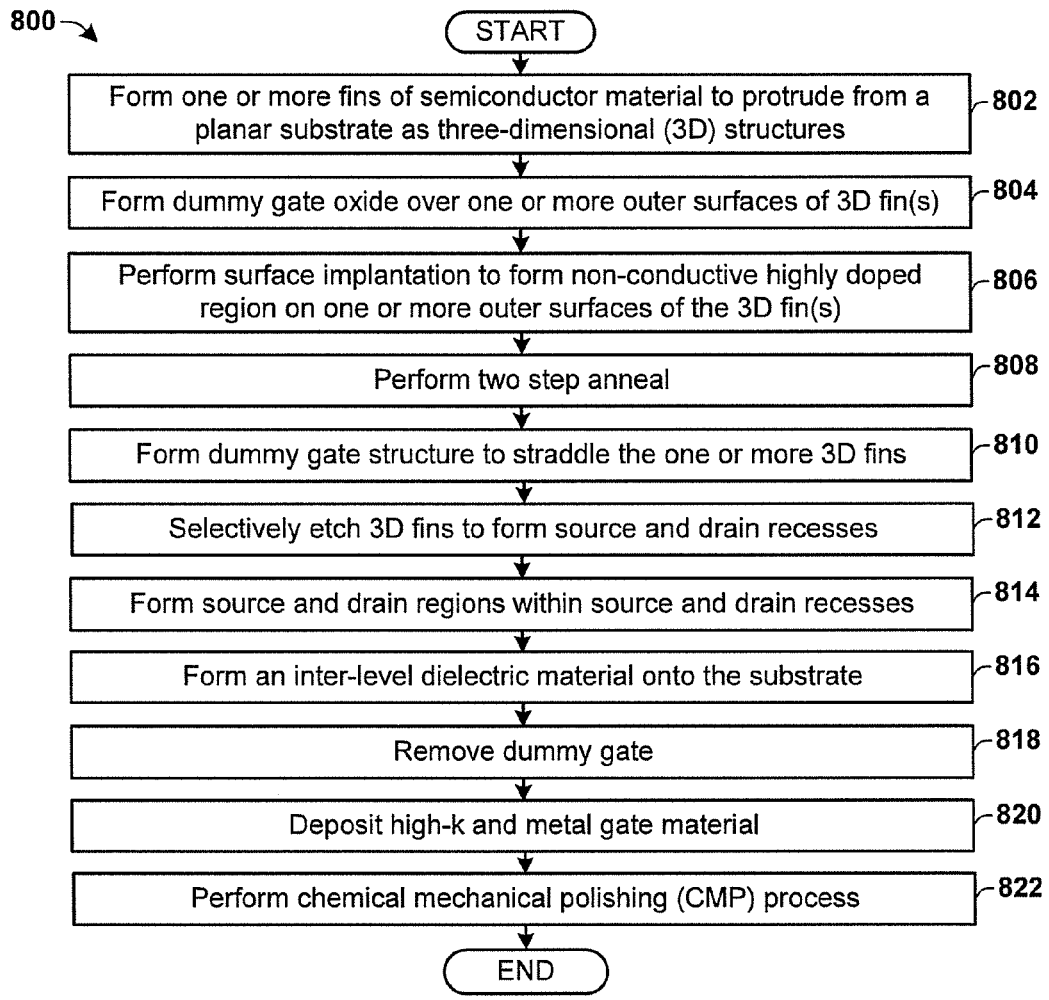
FIG. 8 illustrates some embodiments of a more detailed method of forming a FinFET device comprising the disclosed gate structure.

FIG. 8 illustrates some embodiments of a more detailed method 800 of forming a Fin FET device comprising the disclosed gate structure.

At 802, one or more three-dimensional fins of semiconductor material are formed over a planar substrate. In some embodiments, one or more fins of semiconductor material are separated by sections of dielectric material, so that the sections of dielectric material are interleaved between the sections of semiconductor material along a first direction.

At 804, a dummy gate oxide is formed. The dummy gate oxide is formed to extend over one or more outer surfaces of a three-dimensional fin.

At 806, a surface implantation is performed to form a non-conductive highly doped region on one or more outer surfaces of the one or more three-dimensional fins. The surface implantation is performed through the dummy gate oxide and results in a highly doped region that extends along a surface of the substrate.

At 808, a two step anneal is performed. The two step anneal results in a transient enhanced diffusion (TED), which drives the dopants into the three-dimensional fin broadening the doping profile while also causing a build-up of charge along an outer surface of three-dimensional fin. The resulting dopant profile has a higher dopant concentration along the surface of the three-dimensional fin than within a bulk of the three-dimensional fin. In some embodiments, the two step anneal comprises a first high temperature anneal and a second higher temperature anneal.

At 810, a dummy gate structure is formed. The dummy gate structure is formed to straddle the one or more three-dimensional fins.

At 812, the three-dimensional fins are selectively etched to form source and drain recesses on opposite sides of the dummy gate structure. In some embodiments, the source and drain recesses may be formed by selectively etching the three-dimensional fins using a wet etchant or a dry etchant.

At 814, a source region and a drain region are formed within the source recess and the drain recess, respectively. In some embodiments, the source region and the drain region are formed by epitaxial growth of a doped semiconducting material within the source and drain recesses.

At 816, an inter-level dielectric material is formed onto the substrate. In some embodiments a contact etch stop layer (CESL) may be formed on to the substrate prior to form of the inter-level dielectric layer.

At 818, the dummy gate material is removed to form a cavity within the gate structure.

At 820, a high-k and metal gate material are deposited within the cavity.

At 822, a chemical mechanical polishing (CMP) process is performed to remove excess high-k material and metal gate material from the substrate.

FIGS. 9A-18 illustrate three-dimensional views of some embodiments of an exemplary semiconductor substrate, whereon a method, according to method 800, is implemented. Although FIGS. 9A-18 are described in relation to method 800, it will be appreciated that the structures disclosed in FIGS. 9A-18 are not limited to such a method.

Figure 9A:
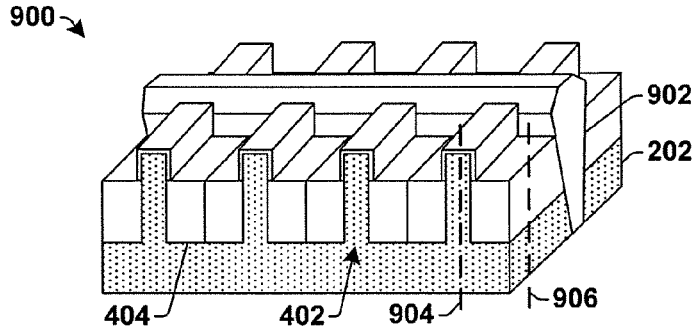

FIG. 9A illustrates a three-dimensional view 900 of a substrate corresponding to acts 802-804. The substrate comprises three-dimensional fins of semiconductor material 402 that protrude from a planar semiconductor substrate 202. The three-dimensional fins of semiconductor material 402 are separated by sections of dielectric material 404, so that the sections of dielectric material 404 are interleaved between the three-dimensional fins of semiconductor material 402.

FIG. 9B illustrates cross-sectional views, 908 and 912, of some embodiments of a substrate corresponding to acts 802-804. Cross-sectional view 908 is drawn across cross-sectional line 904 of FIG. 9A. Cross-sectional view 912 is drawn along cross-sectional line 906 of FIG. 9A.

As shown, a dummy gate dielectric layer 910 is formed over the three-dimensional fins of semiconductor material 402. The dummy gate dielectric layer 910 may comprise a layer of oxide, for example. In some embodiments, the dummy gate dielectric layer 910 may be formed using a thermal process.

FIG. 10 illustrates cross-sectional views, 1000 and 1006, of some embodiments of a substrate corresponding to act 806. As shown, an implantation 1002 is performed to form a highly doped region 1004 located along multiple outer edges of the three-dimensional fin of semiconductor material 402. In some embodiments, the implantation 1002 forms the highly doped region 1004 to have a doping concentration in a range of between approximately $1E18$ $cm^{-3}$ and approximately $1E20$ $cm^{-3}$. In various embodiments, the implantation 1002 may comprise dopant species of boron (B) or borondifluoride ($BF_2$).

Figure 11:
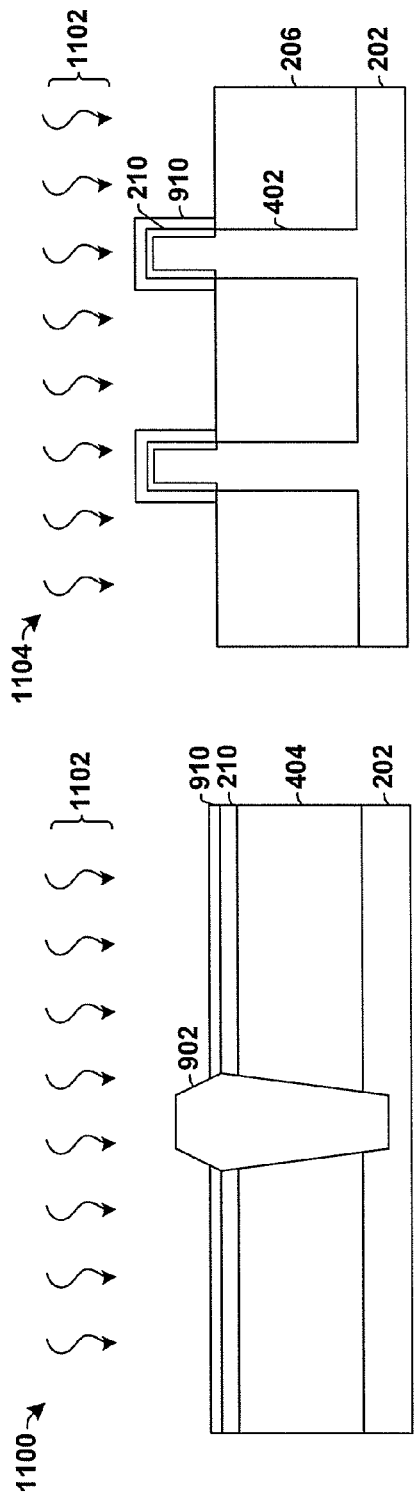

FIG. 11 illustrates cross-sectional views, 1100 and 1104, of some embodiments of a substrate corresponding to act 808. As shown, a two-step anneal 1102 is performed to enable a transient enhanced diffusion (TED) of the dopants. The TED drives the dopants into the three-dimensional fin of semiconductor material 402 to generate a doping profile with a higher dopant concentration along the surface of the three-dimensional fins of semiconductor material 402. The high concentration of dopants along the surface provides for a non-conductive highly doped region 210 along the surface of the three-dimensional fins of semiconductor material 402, since as the doping concentration increases the threshold voltage increases (i.e., a greater voltage is needed to achieve an inversion layer) and prevents the formation of a channel within the highly doped region.

In some embodiments, the two-step anneal 1102 comprises a first high temperature anneal and a second higher temperature anneal. In some embodiments, the first high temperature anneal comprises a first temperature having a range of between approximately 500° C. and 800° C. In some embodiments, the second higher temperature anneal comprises a second temperature having a range of between approximately 900° C. and 1100° C.

Figure 12:
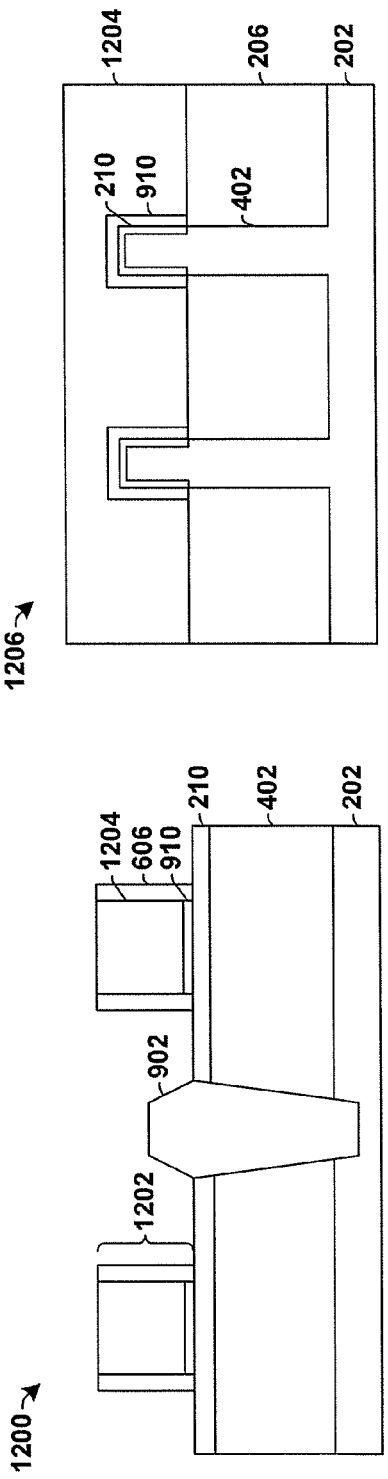

FIG. 12 illustrates cross-sectional views, 1200 and 1206, of some embodiments of a substrate corresponding to act 810. As shown, a dummy gate structure 1202 is formed over the non-conductive highly doped region 210. In some embodiments, the dummy gate structure 1202 is formed by forming a dummy gate material 1204 (e.g., polysilicon) above the dummy gate dielectric layer 910, so that the dummy gate dielectric layer 910 is between the dummy gate material 1204 and the non-conductive highly doped region 210. The dummy gate dielectric layer 910 and the dummy gate material 1204 are selectively etched to constrain the dummy gate dielectric layer 910 and the dummy gate material 1204 within the dummy gate structure 1202.

In some embodiments, sidewall spacers 606, configured to provide electrical isolation of the dummy gate material 1204, may be formed on opposing sides of the dummy gate material 1204. In some embodiments, the sidewall spacers 606 may be formed by depositing nitride onto the substrate and selectively etching the nitride to form the sidewall spacers 606.

FIG. 13 illustrates cross-sectional views, 1300 and 1304, of some embodiments of a substrate corresponding to act 812. As shown, source recesses 1302a are formed in source regions and drain recesses 1302b are formed in drain regions. Formation of the source recesses 1302a and the drain recesses 1302b may be performed using one or more etching processes comprising a dry etching process and/or a wet etching process. For example, in some embodiments, the etching process may use a wet etchant comprising carbon tetrafluoride ($CF_4$), hydrogen flouride (HF), tetramethylammonium hydroxide (TMAH), potassium hydroxide (KOH), ethylene diamine pyrocatechol (EDP), etc.

In some embodiments, the source and drain recesses, 1302a and 1302b, may comprise a width of between approximately 50 Å and approximately 500 Å, and a depth in a range from approximately 50 Å and approximately 600 Å. In other embodiments, the source and drain recesses, 1302a and 1302b, may have other dimensions. It will be appreciated, that although the source and drain recesses, 1302a and 1302b, are illustrated as diamond-shaped recesses, such recess shapes are not limiting and that in general the recesses may have any profile shape.

FIG. 14 illustrates cross-sectional views, 1400 and 1404, of some embodiments of a substrate corresponding to act 814. As shown, a source region 1402a and a drain region 1402b are formed within the source recess 1302a and the drain recess 1302b, respectively. In some embodiments, the source and drain regions, 1402a and 1402b, can be formed by a CDE process comprising chemical vapor deposition (CVD), low pressure CVD (LPCVD), atomic layer CVD (ALCVD), ultrahigh vacuum CVD (UHVCVD), reduced pressure CVD (RPCVD), molecular beam epitaxy (MBE) processes, etc.

In some embodiments, the source region 1402a and the drain region 1402b may comprise epitaxial material grown within the source and drain recesses, 1302a and 1302b. In some embodiments, the epitaxial material may comprise silicon, silicon-germanium (SiGe), silicon-carbide (SiC), etc. In some embodiments, the epitaxial material may comprise a silicon-containing material disposed in-situ. By using the in-situ doping process, the dopant concentration (or level) of the silicon-containing material can be desirably controlled and achieved.

FIG. 15 illustrates cross-sectional views, 1500 and 1506, of some embodiments of a substrate corresponding to act 816. As shown, a contact etch stop layer (CESL) 1502 is formed on to the substrate. The CESL 1502 may comprise a nitride layer, for example. An inter-level dielectric (ILD) layer 1504 is formed onto the substrate at a position above the CESL 1502. In some embodiments the ILD layer 1504 may comprise an oxide, a low-k dielectric material, or an ultra low-k dielectric material.

FIG. 16 illustrates cross-sectional views, 1600 and 1604, of some embodiments of a substrate corresponding to act 818. As shown, the dummy gate material 1204 and the dummy gate dielectric layer 910 are removed, forming a recess 1602 between the sidewall spacers 606. The recess 1602 abuts the non-conductive highly doped region 210. In various embodiments, the dummy gate material 1204 and the dummy gate dielectric layer 910 are removed by a wet chemical etch and/or a dry chemical etch, which utilize an isotropic etch profile.

FIG. 17 illustrates cross-sectional views, 1700 and 1708, of some embodiments of a substrate corresponding to act 820. As shown, a gate dielectric layer 1702 is formed within the recess. A gate material 1704 is formed above the gate dielectric layer 1702. In some embodiments, the gate material may be formed by way of a multi step deposition process that forms a first gate material layer 1704a and then a second gate material layer 1704b. In some embodiments, a single strain inducing or high mobility layer (i.e., single lattice) may be formed above the gate material 1704. In some embodiments, the gate dielectric layer 1702 may comprise silicon dioxide, formed by a thermal process or by a deposition process. In other embodiments, the gate dielectric layer 1702 may comprise a high-k dielectric layer such as hafnium oxide ($HfO_2$), $TiO_2$, $HfZrO$, $Ta_2O_3$, $HfSiO_4$, $ZrO_2$, $ZrSiO_2$, etc., formed by a deposition technique (e.g., atomic layer deposition (ALD)). In some embodiments, the gate material 1704 may comprise a metal (e.g., aluminum) formed using a deposition technique.

FIG. 18 illustrates cross-sectional views, 1800 and 1804, of some embodiments of a substrate corresponding to act 822. As shown, a chemical mechanical polishing process removes excess gate material from the substrate by polishing the substrate along line 1802. The CMP process exposes the top of the gate material 1704.

It will be appreciated that while reference is made throughout this document to exemplary structures in discussing aspects of methodologies described herein, those methodologies are not to be limited by the corresponding structures presented. Rather, the methodologies and structures are to be considered independent of one another and able to stand alone and be practiced without regard to any of the particular aspects depicted in the Figs.

Also, equivalent alterations and/or modifications may occur to one of ordinary skill in the art based upon a reading and/or understanding of the specification and annexed drawings. The disclosure herein includes all such modifications and alterations and is generally not intended to be limited thereby. For example, although the figures provided herein are illustrated and described to have a particular doping type, it will be appreciated that alternative doping types may be utilized as will be appreciated by one of ordinary skill in the art.

In addition, while a particular feature or aspect may have been disclosed with respect to one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ from that illustrated herein.

Therefore, the present disclosure relates to a Fin field effect transistor (FinFET) device having large effective oxide thickness that mitigates hot carrier injection, and an associated method of formation.

In some embodiments, the present disclosure relates to a Fin field effect transistor (FinFET) device. The FinFET device comprises a conductive channel comprising a first fin of semiconducting material protruding from a planar substrate, wherein the conductive channel comprises a non-conductive highly doped region located along multiple outer edges of the conductive channel. The FinFET device further comprises a gate region protruding from the planar substrate as a second fin that overlies the first fin, and a gate dielectric layer located between the non-conductive highly doped region and the gate region.

In other embodiments, the present disclosure relates to a Fin field effect transistor (FinFET) device. The FinFET device comprises a planar substrate comprising a semiconductor material. A conductive channel comprising a first fin of semiconductor material protrudes from the planar substrate and extending along a first direction, wherein the conductive channel comprises a non-conductive highly doped region located along one or more outer edges of the first fin. A gate region protrudes from the planar substrate as a second fin that overlies the first fin, wherein the gate region extends along a second direction perpendicular to the first direction. A gate dielectric layer is disposed between the non-conductive highly doped region and the gate region, wherein the non-conductive highly doped region and the gate dielectric layer collectively provide for an effective oxide thickness of the FinFET device.

In other embodiments, the present disclosure relates to a method of forming a Fin field effect transistor (FinFET) device. The method comprises forming one or more fins of semiconductor material on a planar substrate comprising the semiconductor material. The method further comprises forming a non-conductive highly doped region within an outer surface of the one or more fins of semiconductor material. The method further comprises forming a gate structure protruding from the planar substrate as a second fin that overlies the one or more fins of semiconductor material, wherein the gate structure comprises a gate dielectric layer and a gate material layer over the highly doped region. The method further comprises forming a source region and a drain region on opposite ends of the gate structure at positions that electrically contact the one or more fins of semiconductor material.

What is claimed is:

1. A Fin field effect transistor (FinFET) device, comprising:
a first fin of semiconducting material protruding from a semiconductor substrate, wherein the first fin of semiconducting material comprises a channel region and a highly doped region located along multiple outer edges of the channel region;
a gate region protruding from the semiconductor substrate as a second fin that overlies the first fin of semiconducting material; and
a gate dielectric layer located between the highly doped region and the gate region;
wherein the highly doped region is vertically and laterally arranged between the channel region and the gate dielectric layer.

2. The FinFET device of claim 1,
wherein the highly doped region comprises an inverted 'U' shape having two vertical segments, extending outward from a lateral segment abutting a to of the first fin of semiconducting material, along sidewalls of the first fin of semiconducting material,
wherein the highly doped region is nested within the gate dielectric layer so that the highly doped region and the gate dielectric layer form concentric structures.

3. The FinFET device of claim 2, wherein the two vertical segments abut the gate dielectric layer on one side and the channel region on an opposing second side.

4. The FinFET device of claim 1, wherein the highly doped region comprises sidewalls that form planar surfaces with sidewalls of an underlying semiconductor material.

5. The FinFET device of claim 1, wherein the highly doped region has a doping concentration in a range of between approximately 1E18 $cm^{-3}$ and approximately 1E20 $cm^{-3}$.

6. The FinFET device of claim 1, wherein the highly doped region has a dopant species of boron (B) or borondifluoride ($BF_2$).

7. The FinFET device of claim 1, wherein the highly doped region comprises a higher doping concentration than a bulk of the first fin of semiconducting material.

8. The FinFET device of claim 1, wherein the non conductive highly doped region has a first height that is less than a second height of the gate dielectric layer.

9. A Fin field effect transistor (FinFET) device, comprising:
a planar substrate comprising a semiconductor material;
a channel region comprising a first fin of semiconductor material protruding from the planar substrate and extending along a first direction, wherein the first fin of semiconductor material comprises a highly doped region located along one or more outer edges of the first fin of semiconductor material;
a gate region protruding from the planar substrate as a second fin that overlies the first fin of semiconductor material, wherein the gate region extends along a second direction perpendicular to the first direction; and
a gate dielectric layer disposed between the highly doped region and the gate region, wherein the highly doped region extends from a to of the first fin of semiconducting material to a location that is substantially aligned with a bottom surface of the gate region.

10. The FinFET device of claim 9, wherein the highly doped region has a doping concentration in a range of between approximately 1E18 $cm^{-3}$ and approximately 1E20 $cm^{-3}$.

11. The FinFET device of claim 10, wherein the highly doped region has a dopant species of boron (B) or borondifluoride ($BF_2$).

12. The FinFET device of claim 9, wherein the highly doped region is disposed within a top portion of the first fin of semiconductor material and comprises sidewalls that form planar surfaces with sidewalls of an underlying lower portion of the first fin of semiconductor material.

13. The FinFET device of claim 9, further comprising:
sections of dielectric material extending along the first direction and separating the first fin of semiconductor material from additional fins of semiconductor material extending parallel to the first fin of semiconductor material.

14. The FinFET device of claim 9, wherein the highly doped region is vertically and laterally arranged between the channel region and the gate dielectric layer.

15. A Fin field effect transistor (FinFET) device, comprising:
a first fin of semiconducting material protruding from a top surface of a semiconductor substrate and extending along a first direction;
a gate region protruding from the top surface of the semiconductor substrate as a second fin that extends along a second direction, perpendicular to the first direction, and which overlies the first fin; and
a region located along a top surface and sidewalls of the first fin of semiconducting material, and having a first doping concentration that is higher than a second doping concentration of underlying sections of the first fin of semiconducting material, wherein the region is laterally disposed between source and drain regions that vertically extend to positions that are below the gate region; and
a gate dielectric layer disposed between the gate region and a top surface and sidewalls of the region.

16. The FinFET device of claim 15, wherein the region has a first height that is less than a second height of the gate dielectric layer.

17. The FinFET device of claim 15, wherein the region is disposed within a top portion of the first fin of semiconducting material and comprises sidewalls that form planar surfaced with sidewalls of an underlying lower portion of the first fin of semiconducting material.

18. The FinFET device of claim 15, wherein the region comprises a same semiconductor material as the first fin of semiconducting material.

19. The FinFET device of claim 15, wherein the gate dielectric layer comprises one or more of silicon oxide ($SiO_2$), hafnium oxide ($HfO_2$), titanium oxide ($TiO_2$), hafnium zirconium oxide (HfZrO), tantalum oxide ($Ta_2O_3$), hafnium silicon oxide ($HfSiO_4$), zirconium oxide ($ZrO_2$), zirconium silicon oxide ($ZrSiO_2$).

20. The FinFET device of claim 15, further comprising:
sections of dielectric material extending along the first direction and separating the first fin from additional fins of semiconductor material.

* * * * *

UNITED STATES PATENT AND TRADEMARK OFFICE
CERTIFICATE OF CORRECTION

PATENT NO. : 9,000,536 B2
APPLICATION NO. : 13/930242
DATED : April 7, 2015
INVENTOR(S) : Chih-Wei Kuo et al.

Page 1 of 1

It is certified that error appears in the above-identified patent and that said Letters Patent is hereby corrected as shown below:

In the Claims

Column 10, Claim 2, Line 12 replace "...abutting a to of the..." with --...abutting a top of the...--

Column 10, Claim 9, Line 51 replace "...extends from a to of the..." with --...extends from a top of the...--

Signed and Sealed this
Fourth Day of August, 2015

Michelle K. Lee
*Director of the United States Patent and Trademark Office*